(12) United States Patent
Yip

(10) Patent No.: US 6,577,251 B1
(45) Date of Patent: Jun. 10, 2003

(54) ACCESSING SUB-BLOCKS OF SYMBOLS FROM MEMORY

(75) Inventor: Dominic Yip, Lindfield (AU)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/824,657

(22) Filed: Apr. 4, 2001

(30) Foreign Application Priority Data

Apr. 4, 2000 (AU) .............................................. PQ6685

(51) Int. Cl.[7] .............................................. H03M 7/00
(52) U.S. Cl. .......................... 341/50; 341/61; 364/200; 382/308
(58) Field of Search .............................. 341/50, 51, 52, 341/61; 395/312, 569; 382/308

(56) References Cited

U.S. PATENT DOCUMENTS

| | | | | |
|---|---|---|---|---|
| 4,727,474 A | * | 2/1988 | Batcher | 364/200 |
| 4,959,776 A | * | 9/1990 | Deerfield et al. | 364/200 |
| 5,223,926 A | | 6/1993 | Stone et al. | 358/133 |
| 5,497,467 A | * | 3/1996 | Wakui et al. | 395/312 |
| 5,615,348 A | * | 3/1997 | Koino et al. | 395/569 |
| 5,684,896 A | | 11/1997 | Stone et al. | 382/239 |
| 5,757,973 A | | 5/1998 | Wilkinson et al. | 382/246 |
| 5,872,987 A | * | 2/1999 | Wade et al. | 395/800.03 |
| 6,125,432 A | * | 9/2000 | Hanami et al. | 711/157 |
| 6,208,772 B1 | * | 3/2001 | Wilt et al. | 382/308 |
| 6,304,887 B1 | * | 10/2001 | Ju et al. | 708/404 |

OTHER PUBLICATIONS

"JPEG 2000 Image Coding System"; JPEG 2000 Committee Draft Version 1.0, Dec. 9, 1999; pp. 1–164.

Daniel Lee, A Study of JPEG 2000 Still Image Coding Versus Other Standards, Jul. 2000, Paper to be Published in the Proceedings of EUSIPCO 2000.

* cited by examiner

Primary Examiner—Brian Young
Assistant Examiner—John Nguyen
(74) Attorney, Agent, or Firm—Fitzpatrick, Cella, Harper & Scinto

(57) ABSTRACT

There is disclosed apparatus (106) for accessing items of information. The apparatus (106) comprises sixteen memory banks (202) and an address generator (204). Each of the sixteen memory banks (202) stores items of information associated with and corresponding to respective symbols of a sub-set of the symbols. These sub-sets of symbols are mutually exclusive and together comprise a set of symbols. The items of information of the sixteen memory banks (202) together constitute the whole of the items of information associated with and corresponding to the respective symbols of the set of symbols with no duplication of the items of information. The address generator (204) simultaneously generates sixteen addresses for the respective sixteen memory banks (202) in response to one input address, wherein the memory banks (202) output sixteen items of information associated with and corresponding to the respective symbols within a 4×4 neighbourhood of the symbol corresponding to said input address.

51 Claims, 8 Drawing Sheets

| Row Remainder | Column Remainder | Sub-Table |
|---|---|---|
| 0 | 0 | A |
| 0 | 1 | B |
| 0 | 2 | C |
| 0 | 3 | D |
| 1 | 0 | E |
| 1 | 1 | F |
| 1 | 2 | G |
| 1 | 3 | H |
| 2 | 0 | I |
| 2 | 1 | J |
| 2 | 2 | K |
| 2 | 3 | L |
| 3 | 0 | M |
| 3 | 1 | N |
| 3 | 2 | O |
| 3 | 3 | P |

Fig. 4

| s | t | A | B | C | D | E | F | G | H | I | J | K | L | M | N | O | P |
|---|---|---|---|---|---|---|---|---|---|---|---|---|---|---|---|---|---|
| 0 | 0 | q,r | q,r | q,r | q-1,r | q,r | q,r | q,r | q-1,r | q,r | q,r | q,r | q-1,r | q,r-1 | q,r-1 | q,r-1 | q-1,r-1 |
| 1 | 0 | q,r | q,r | q,r | q,r | q,r | q,r | q,r | q,r | q,r | q,r | q,r | q,r | q,r-1 | q,r-1 | q,r-1 | q,r-1 |
| 2 | 0 | q+1,r | q,r | q,r | q,r | q+1,r | q,r | q,r | q,r | q+1,r | q,r | q,r | q,r | q+1,r-1 | q,r-1 | q,r-1 | q,r-1 |
| 3 | 0 | q+1,r | q+1,r | q,r | q,r | q+1,r | q+1,r | q,r | q,r | q+1,r | q+1,r | q,r | q-1,r | q+1,r-1 | q+1,r-1 | q,r-1 | q-1,r-1 |
| 0 | 1 | q,r | q,r | q,r | q-1,r | q,r | q,r | q,r | q-1,r | q,r | q,r | q,r | q,r | q,r | q,r | q,r | q,r |
| 1 | 1 | q,r | q,r | q,r | q,r | q,r | q,r | q,r | q,r | q,r | q,r | q,r | q,r | q,r | q,r | q,r | q,r |
| 2 | 1 | q+1,r | q,r | q,r | q,r | q+1,r | q,r | q,r | q,r | q+1,r | q,r | q,r | q,r | q+1,r | q+1,r | q,r | q,r |
| 3 | 1 | q+1,r | q+1,r | q,r | q,r | q+1,r | q+1,r | q,r | q,r | q+1,r | q+1,r | q,r | q-1,r | q+1,r | q+1,r | q,r | q,r |
| 0 | 2 | q,r+1 | q,r+1 | q,r+1 | q-1,r+1 | q,r | q,r | q,r | q,r | q,r | q,r | q,r | q,r | q,r | q,r | q,r | q,r |
| 1 | 2 | q,r+1 | q,r+1 | q,r+1 | q,r+1 | q,r | q,r | q,r | q,r | q,r | q,r | q,r | q,r | q+1,r | q+1,r | q,r | q,r |
| 2 | 2 | q+1,r+1 | q,r+1 | q,r+1 | q,r+1 | q+1,r | q,r | q,r | q,r | q+1,r | q,r | q,r | q,r | q+1,r | q+1,r | q,r | q,r |
| 3 | 2 | q+1,r+1 | q+1,r+1 | q,r+1 | q,r+1 | q+1,r | q+1,r | q,r | q,r | q+1,r | q+1,r | q,r | q-1,r+1 | q+1,r | q+1,r | q,r | q,r |
| 0 | 3 | q,r+1 | q,r+1 | q,r+1 | q-1,r+1 | q,r+1 | q,r+1 | q,r+1 | q-1,r+1 | q,r | q,r | q,r | q,r | q,r | q,r | q,r | q-1,r |
| 1 | 3 | q,r+1 | q,r+1 | q,r+1 | q,r+1 | q,r+1 | q,r+1 | q,r+1 | q,r+1 | q,r | q,r | q,r | q,r | q,r | q,r | q,r | q,r |
| 2 | 3 | q+1,r+1 | q+1,r+1 | q,r+1 | q,r+1 | q+1,r+1 | q,r+1 | q,r+1 | q,r+1 | q+1,r | q,r | q,r | q,r | q+1,r | q,r | q,r | q,r |
| 3 | 3 | q+1,r+1 | q+1,r+1 | q,r+1 | q,r+1 | q+1,r+1 | q+1,r+1 | q,r+1 | q,r+1 | q+1,r | q+1,r | q,r | q,r | q+1,r | q+1,r | q,r | q,r |

Fig. 6

| s | t | -1,-1 | 0,-1 | 1,-1 | 2,-1 | -1,0 | 0,0 | 1,0 | 2,0 | -1,1 | 0,1 | 1,1 | 2,1 | -1,2 | 0,2 | 1,2 | 2,2 |
|---|---|---|---|---|---|---|---|---|---|---|---|---|---|---|---|---|---|
| 0 | 0 | P | M | N | O | D | A | B | C | H | E | F | G | L | I | J | K |
| 1 | 0 | M | N | O | P | A | B | C | D | E | F | G | H | I | J | K | L |
| 2 | 0 | N | O | P | M | B | C | D | A | F | G | H | E | J | K | L | I |
| 3 | 0 | O | P | M | N | C | D | A | B | G | H | E | F | K | L | I | J |
| 0 | 1 | D | A | B | C | H | E | F | G | L | I | J | K | P | M | N | O |
| 1 | 1 | A | B | C | D | E | F | G | H | I | J | K | L | M | N | O | P |
| 2 | 1 | B | C | D | A | F | G | H | E | J | K | L | I | N | O | P | M |
| 3 | 1 | C | D | A | B | G | H | E | F | K | L | I | J | O | P | M | N |
| 0 | 2 | H | E | F | G | L | I | J | K | P | M | N | O | D | A | B | C |
| 1 | 2 | E | F | G | H | I | J | K | L | M | N | O | P | A | B | C | D |
| 2 | 2 | F | G | H | E | J | K | L | I | N | O | P | M | B | C | D | A |
| 3 | 2 | G | H | E | F | K | L | I | J | O | P | M | N | C | D | A | B |
| 0 | 3 | L | I | J | K | P | M | N | O | D | A | B | C | H | E | F | G |
| 1 | 3 | I | J | K | L | M | N | O | P | A | B | C | D | E | F | G | H |
| 2 | 3 | J | K | L | I | N | O | P | M | B | C | D | A | F | G | H | E |
| 3 | 3 | K | L | I | J | O | P | M | N | C | D | A | B | G | H | E | F |

Fig. 7

ACCESSING SUB-BLOCKS OF SYMBOLS FROM MEMORY

TECHNICAL FIELD OF THE INVENTION

The present invention relates to a method and apparatus of accessing items of information. The present invention also relates to a method and apparatus for entropy encoding and decoding symbols.

BACKGROUND

The field of digital data compression and in particular digital image compression has attracted great interest for some time.

In the field of digital image compression, many different techniques have been utilised. In particular, one popular technique is the JPEG standard, which utilises the Discrete Cosine Transform to transform standard size blocks of an image into corresponding cosine components. In this respect, the higher frequency cosine components are heavily quantised so as to assist in obtaining substantial compression factors. The heavy quantisation is an example of a "lossy" technique of image compression. The JPEG standard also provides for the subsequent "lossless" compression of the transformed coefficients.

A call for proposals for the new JPEG-2000 standard was recently issued and a draft standard has been published entitled "Information Technology—JPEG 2000 Image coding System—JPEG 2000 Committee Draft version 1.0, Dec. 9, 1999". This draft standard proposes that the whole image is firstly discrete wavelet transformed and divided into a number of code blocks of transform coefficients before each code block is entropy encoded. The entropy encoder consists of two parts: a context generator and an arithmetic coder. The arithmetic coder takes as input the bit symbol of a coefficient to be encoded and the context of that bit symbol. The arithmetic coder first codes all the bit symbols of the most significant bit-plane of a code block, then all the bit symbols of the next lower bit-plane of the code block and so on to the least significant bit-plane. Within each bit-plane of a code block, the arithmetic coder codes the bit symbols of the coefficients in a predetermined order. The context of a bit symbol of a coefficient, which bit symbol is to be coded by the arithmetic coder, is based on the 'significance' state of the 8 surrounding coefficients in the code block. When the surrounding coefficient is outside the code block, it can be symmetrically reflected or assumed to be zero. The 'significance' state of a coefficient is a binary-valued variable, $\sigma_i[m,n]$, which is initialised to 0, but transitions to 1 when the coefficient's first non-zero bit-plane value is encoded. For example, a pixel coefficient having an integer value of seven and thus a binary value of 00111 will have a 'significance' state of zero in bit-planes four and three and a 'significance' state of one in bit-planes two, one and zero. It has been proposed to use a memory table for the look-up and update of the context generation. One proposal is to have a number of identical tables storing identical information on the 'significance' state of the coefficients. In this apparatus, the different locations are simultaneously looked up in respective tables to obtain the 'significance' state of the surrounding coefficients. Thus, all the data is duplicated many times, and the hardware cost may be large. Another proposal is to have one table and look up the table several times to obtain the 'significance' state of all the coefficients in the neighbourhood. This has the advantage of low hardware cost, but this architecture is too slow.

DISCLOSURE OF THE INVENTION

It is an object of the present invention to substantially overcome, or at least ameliorate, one or more disadvantages of existing arrangements.

According to a first aspect of the invention, there is provided apparatus for accessing items of information in a neighbourhood of a location of a symbol specified by an input address, the apparatus comprising: a plurality of memory banks, wherein each memory bank is capable of storing items of information associated with and corresponding to respective symbols of a sub-set of said symbols, wherein the sub-sets of symbols together comprise a set of symbols, and said items of information of said plurality of memory banks together constitute the whole said items of information associated with and corresponding to respective said symbols of said set of symbols; and an address generator for simultaneously generating a plurality of addresses for respective said plurality of memory banks in response to said input address, wherein said plurality of memory banks output a said plurality of said items of information associated with and corresponding to respective said symbols within said neighbourhood of said symbol corresponding to said input address.

According to a second aspect of the invention, there is provided an entropy encoder for encoding symbols, the entropy encoder comprising: a plurality of memory banks, wherein each memory bank is capable of storing items of information associated with and corresponding to respective symbols of a sub-set of said symbols, wherein the sub-sets of symbols together comprise a set of symbols, and said items of information of said plurality of memory banks together constitute the whole said items of information associated with and corresponding to respective said symbols of said set of symbols; an arithmetic encoder for arithmetically encoding an input symbol utilising a context of said input symbol; an address generator for simultaneously generating a plurality of addresses for respective said plurality of memory banks in response to one input address corresponding to said input symbol, wherein said plurality of memory banks output a said plurality of said items of information associated with and corresponding to respective said symbols within a neighbourhood of said input symbol corresponding to said input address; and a context generator for generating said context of said input symbol utilising said items of information output by said plurality of memory banks.

According to a third aspect of the invention, there is provided an entropy decoder for decoding symbols, the entropy decoder comprising: a plurality of memory banks, wherein each memory bank is capable of storing items of information associated with and corresponding to respective decoded symbols of a sub-set of said decoded symbols, wherein the sub-sets of decoded symbols together comprise a set of decoded symbols, and said items of information of said plurality of memory banks together constitute the whole said items of information associated with and corresponding to respective said decoded symbols of said set of decoded symbols; an arithmetic decoder for arithmetically decoding an input symbol utilising a context of said input symbol; an address generator for simultaneously generating a plurality of addresses for respective said plurality of memory banks in response to one input address corresponding to said input symbol, wherein said plurality of memory banks output a said plurality of said items of information associated with and corresponding to respective said decoded symbols within a neighbourhood of said input symbol corresponding to said input address; and a context generator for generating said context of said input symbol utilising said items of information output by said plurality of memory banks.

According to a fourth aspect of the invention, there is provided a method of accessing items of information in a neighbourhood of a location of a symbol specified by an input address, the method comprising: storing items of information associated with and corresponding to respective symbols of a sub-set of said symbols in each one of a plurality of memory banks, wherein the sub-sets of symbols together comprise a set of symbols, and said items of information of said plurality of memory banks together constitute the whole said items of information associated with and corresponding to respective said symbols of said set of symbols; and simultaneously generating a plurality of addresses for respective said plurality of memory banks in response to said input address, wherein said plurality of memory banks output a said plurality of said items of information associated with and corresponding to respective said symbols within said neighbourhood of said symbol corresponding to said input address.

According to a fifth aspect of the invention, there is provided a method of entropy encoding symbols, the method comprising: storing items of information associated with and corresponding to respective symbols of a sub-set of said symbols in each one of a plurality of memory banks, wherein the sub-sets of symbols together comprise a set of symbols, and said items of information of said plurality of memory banks together constitute the whole said items of information associated with and corresponding to respective said symbols of said set of symbols; arithmetically encoding an input symbol utilising a context of said input symbol; simultaneously generating a plurality of addresses for respective said plurality of memory banks in response to one input address corresponding to said input symbol, wherein said plurality of memory banks output a said plurality of said items of information associated with and corresponding to respective said symbols within a neighbourhood of said input symbol corresponding to said input address; and generating said context of said input symbol utilising said items of information output by said plurality of memory banks.

According to a sixth aspect of the invention, there is provided a method of entropy decoding symbols, the method comprising: storing items of information associated with and corresponding to respective decoded symbols of a sub-set of said decoded symbols in each one of a plurality of memory banks, wherein the sub-sets of decoded symbols together comprise a set of decoded symbols, and said items of information of said plurality of memory banks together constitute the whole said items of information associated with and corresponding to respective said decoded symbols of said set of decoded symbols; arithmetically decoding an input symbol utilising a context of said input symbol; simultaneously generating a plurality of addresses for respective said plurality of memory banks in response to one input address corresponding to said input symbol, wherein said plurality of memory banks output a said plurality of said items of information associated with and corresponding to respective said decoded symbols within a neighbourhood of said input symbol corresponding to said input address; and generating said context of said input symbol utilising said items of information output by said plurality of memory banks.

BRIEF DESCRIPTION OF THE DRAWINGS

A number of preferred embodiments of the present invention will now be described with reference to the drawings, in which:

FIG. 4 shows a Table, which illustrates the mapping of the 'significance' states of coefficients of a code block to the sub-tables A to P of FIG. 2;

FIG. 6 shows a Table, which illustrates the read addressing of the sub-tables A to P of FIG. 2;

FIG. 7 shows a Table, which illustrates how the output multiplexers 206 of FIG. 2 rearrange the results from the sub-tables A to P of FIG. 2.

DETAILED DESCRIPTION INCLUDING BEST MODE

Figure 1:
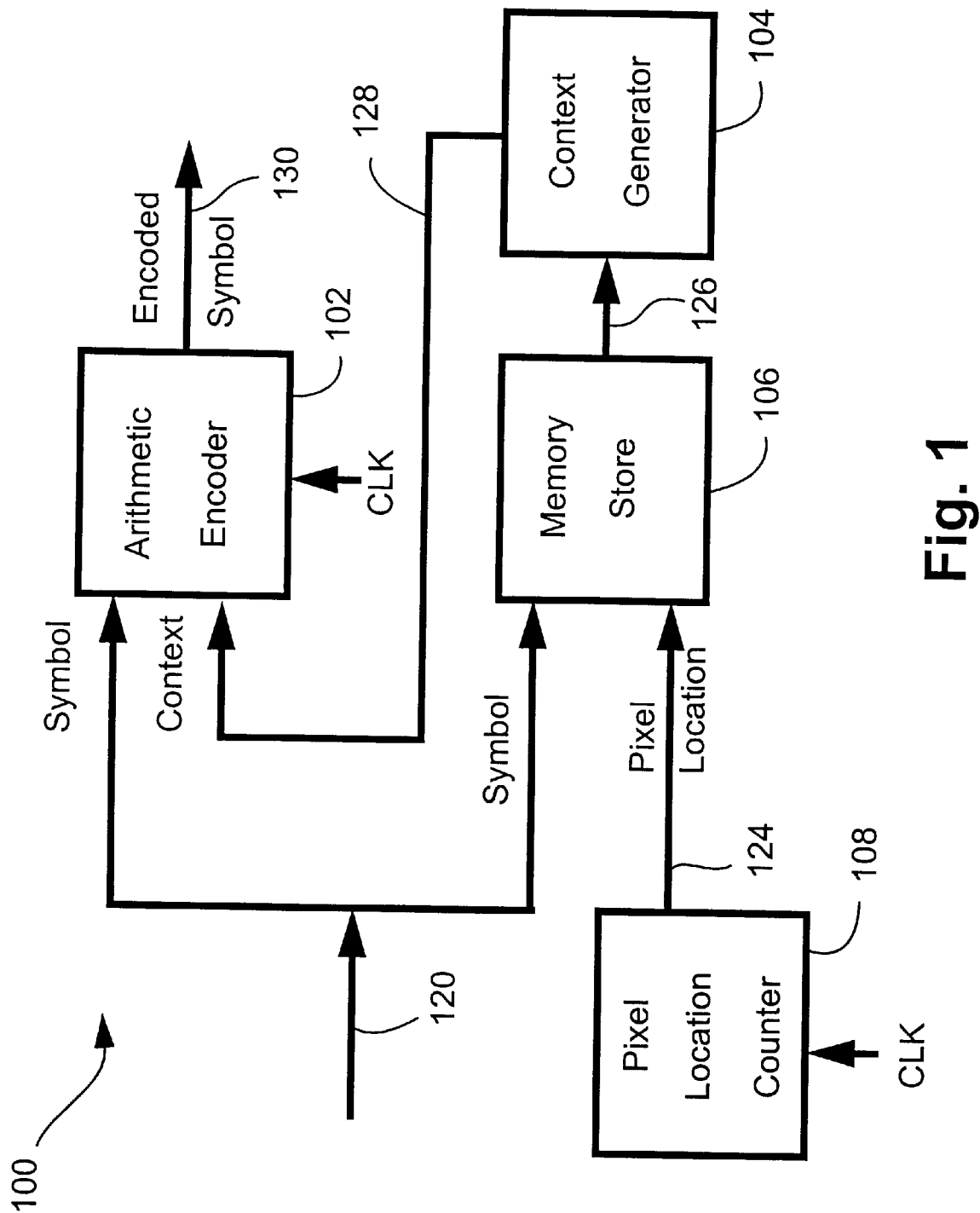
FIG. 1 shows a schematic diagram of an entropy encoder comprising an arithmetic encoder and context generator.

Where reference is made in any one or more of the accompanying drawings to steps and/or features, which have the same reference numerals, those steps and/or features have for the purposes of this description the same function (s) or operation(s), unless the contrary intention appears.

The principles of the preferred method described herein have general applicability to entropy coding and, in particular, to arithmetic coding and context generation. However, for ease of explanation, the steps of the preferred method are described with reference to an entropy encoder suitable for use with the JPEG 2000 draft standard hereinbefore mentioned. However, it is not intended that the present invention be limited to the described entropy encoder. For example, the invention may have application to an entropy decoder.

FIG. 1 illustrates an entropy encoder 100 suitable for use with the JPEG 2000 draft standard hereinbefore mentioned. The entropy encoder 100 comprises an arithmetic coder 102, a context generator 104, a pixel location counter 108, and a memory store 106 for storing the 'significance' state of the coefficients of a code block at the current bit-plane. The arithmetic coder 102 takes as input the bit symbol 120 to be encoded of a coefficient, and the context 128 of that bit symbol. The arithmetic coder 102 first codes all the bit symbols of the most significant bit-plane of a code block, then all the bit symbols of the next lower bit-plane of the code block and so on to the least significant bit-plane. The arithmetic coder 102 codes the bit symbols of each bit-plane of a code block in a predetermined order according to the draft JPEG 2000 standard hereinbefore mentioned. The order which these bit symbols are encoded is not essential to the invention and will not be described further. The context of a bit symbol of a coefficient, which bit symbol is to be coded by the arithmetic coder 102, is based on the 'significance' state of the 8 surrounding pixel coefficients in the same bit-plane of the code block. These 8 pixel coefficients together with the pixel coefficient they surround form a 3×3 neighbourhood of coefficients.

As mentioned before, the 'significance' state of a coefficient is a binary-valued variable, $\sigma_i[m,n]$, which is initialised to 0 (zero), but transitions to 1 (one) when the coefficient's first non-zero bit-plane value is encoded.

Preferably, the memory store 106 stores for each pixel coefficient in the code block the current 'significance' state of the coefficient at an address corresponding to the pixel coefficient's location in the code block. Initially, the 'significance' state of all the bit symbols of a code block stored in the memory store 106 are set to zero. When a coefficient's first non-zero bit-plane value is encoded by the arithmetic coder 102, the 'significance' state of the coefficient stored in the memory store 106 is updated to 1 (one). This is achieved by in the following manner. If the incoming bit is zero (0) then the original 'significance' state is not changed. If the incoming bit is one (1) then always write it as the new 'significance' state to the memory store 106. In this way, there is no need for a double read/write to the memory store 106.

Alternatively, each pixel coefficient of the code block can be pre-processed and the bit-plane number at which the coefficient's 'significance' state changes is stored in the memory store 106 at an address corresponding to the pixel coefficient's location in the code block.

The context 128 of a bit symbol, which is to be coded by the arithmetic coder 102, is generated by the context generator 104. The context 128 is based on the 'significance' states of the 8 surrounding pixel coefficients, which are output 126 from the memory store 106. These eight 'significance' states in the memory store 106 are addressed by the pixel coefficient location of the bit symbol being encoded, which pixel coefficient location is supplied by the pixel counter 108. The output 126 from the memory store 106 is fed into the context generator 104, which determines what context state 128 those eight 'significance' states belong to and feeds that context state 128 to the arithmetic coder 102. The context 128 of a bit symbol is generated in accordance with the draft JPEG 2000 standard and is not essential to the present invention and will not be described any further.

The operation of the pixel location counter 108, memory store 106, context generator 104, and arithmetic coder 102 are controlled by a clock controller (not shown) by means of clock signals (CLK). The entropy coder 100 receives as input a symbol bit 120 to be encoded in one cycle. The memory store 106 outputs the 8 'significance' states of the surrounding coefficients in the 3×3 neighbourhood of the addressed symbol bit's location in the same one cycle. In order to achieve this throughput, the memory store 106 comprises sixteen memory banks each storing a respective portion of the 'significance' states of the code block. These sixteen memory banks together constitute the total 'significance' states of the code block with no duplication of any data. The memory store 106 simultaneously addresses these sixteen memory banks with the pixel location of the symbol bit to be encoded, which memory banks return the 'significance' states of coefficients in a 4×4 neighbourhood surrounding the addressed pixel location including the 'significance' state of the addressed pixel location. The 'significance' states of the 4×4 neighbourhood are sent to the context generator 104, which in the same clock cycle outputs the context 128 to the arithmetic coder 102, which in turn encodes the symbol bit in the same clock cycle. As will be apparent to a person skilled in the art, the context generator 104 only needs the 'significance' states of the coefficients in the 3×3 neighbourhood surrounding the bit symbol to be encoded. Thus context generator 104 can discard those 'significance' states of those pixel coefficients not required by the context generator 104.

Figure 2:
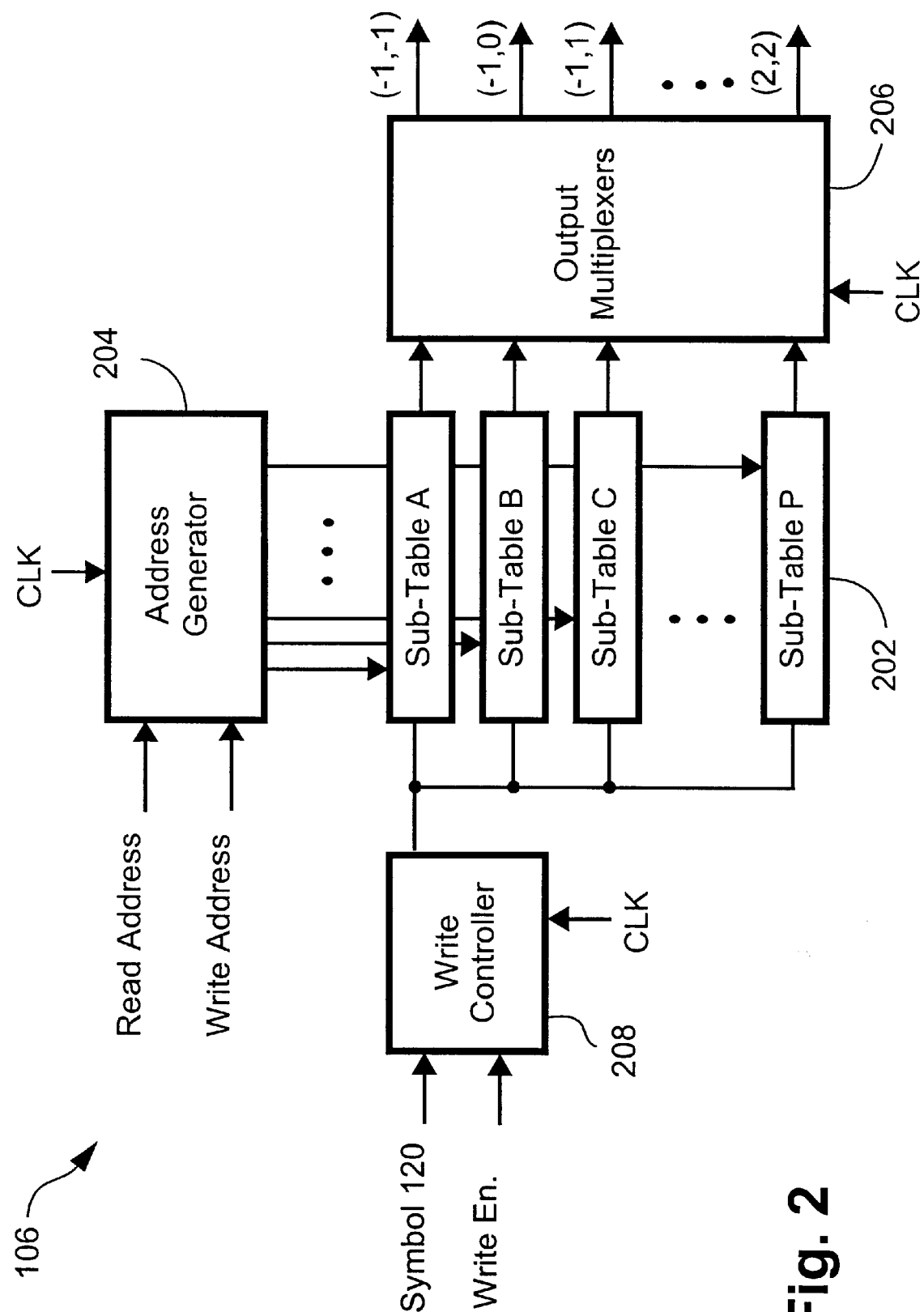
FIG. 2 shows the memory store 106 of FIG. 1 in more detail.

Turning now to FIG. 2, there is shown the memory store 106 of FIG. 1 in more detail. The memory store 106 comprises sixteen memory banks 202 storing respectively tables A, B, C, D, E, F, G, H, I, J, K, L, M, N, O, and P. The memory store 106 ffurther comprises an address generator 204 for simultaneously addressing the sixteen memory banks 202 storing the tables A to P. The pixel location 124 is fed as the read address to the address generator, which contains address generator logic for simultaneously generating sixteen corresponding addresses for the sixteen memory banks 202.

In the preferred embodiment, the sixteen memory banks 202 store the current 'significance' states of the coefficients of the code block. These memory banks then supply to the output multiplexers 206 the 'significance' states of a 4×4 neighbourhood surrounding the addressed pixel location including with the 'significance' state associated with the addressed pixel location. The output multiplexers 206 re-arrange the order of these 'significance' states, which are then sent to the context generator 104.

The outputs of the multiplexers 206 are identified in FIG. 2 by the coordinates (−1,−1), (−1,0), (−1,1), . . . , and (2,2) respectively, which indicate the pixel locations of the 4×4 neighbourhood. The output multiplexers 206 re-arrange the order of the 'significance' states output by the sixteen memory banks 202 so that the relevant 'significance' states go to the correct outputs of the multiplexers 206. For example, the output (0,0) will supply the current 'significance' state of the bit symbol to encoded; output (−1,−1) will supply the current 'significance' state of the coefficient that is one coefficient up and to the left of the coefficient containing the bit symbol to be encoded; output (1,1) will supply the current 'significance' state of the coefficient that is one coefficient down and to the right of the coefficient containing the bit symbol to be encoded; and so on.

When a coefficient's first non-zero bit-plane value is encoded by the arithmetic coder 102, the 'significance' state of the corresponding coefficient stored in the memory store 106 is updated to 1 (one).

Preferably, this is achieved by logic circuitry in the write controller 208. The write controller 208 receives the current symbol 120 to be encoded and determines if it is a zero (0) or one (1). If the current symbol 120 to be encoded is a zero (0) then the original 'significance' state stored in the sub-tables 202 is not changed. On the other hand, if the current symbol 120 to be encoded is a one (1) then the write controller 208 will write the current symbol 120 as the new 'significance' state to the sub-tables 202. The address generator 204 receives the pixel coefficient location 124 of the current symbol 120 to be encoded for writing a change in the 'significance' state at the relevant location in the sub-tables. The write controller 208 writes the change in 'significance' state, once a write enable signal has been received. The write enable signal is supplied to the write controller 208 only after the eight 'significance' states are addressed by the pixel coefficient location 124 of the current symbol 120 to be encoded and output to the context generator 104. The write and read can happen simultaneously, as the read locations are different from the write location.

In an alternative embodiment, the bit-plane number at which the coefficient's 'significance' state changes is stored in the memory store 106 at an address corresponding to the pixel coefficient's location in the code block. In this alternative embodiment, the sixteen memory banks 202 output the bit-plane numbers of the 'significance' states of the 4×4 neighbourhood. These bit-plane numbers are output to a logic circuit (not shown), which also receives as input the current bit-plane presently being encoded, and the pixel location of the bit symbol of the coefficient currently being encoded. This logic circuit then determines the 'significance' state of the coefficients of the 4×4 neighbourhood. The logic circuit determines the 'significance' state in the following manner. If the current bit-plane presently being encoded is less than or equal to the bit-plane number of a pixel location output by a memory bank, and the bit symbol at that pixel location in the current bit-plane is being or has been encoded, then the current 'significance' state of the coefficient at that pixel location is one (1). Otherwise, the current 'significance, state of the coefficient at that pixel location is zero (0).

Preferably, the entropy encoder 100 can handle code blocks of different sizes. According to the draft JPEG 2000 standard hereinbefore mentioned, the code block width and height are limited to powers of two with the minimum size being $2^2$ and the maximum size being $2^{10}$. Furthermore, the code block size is restricted to width+height<=12. Thus the number of coefficient can vary from a minimum of $2^2 \times 2^2$ coefficients to a maximum of $2^6 \times 2^6$ coefficients. Thus each of the sixteen memory banks 202 preferably should be able to store a sub-table of 16×16 'significance' states of one bit. In the alternative embodiment, each of the memory banks 202 preferably should be able to store a sub-table of 16×16 bit-plane numbers.

Figure 3:
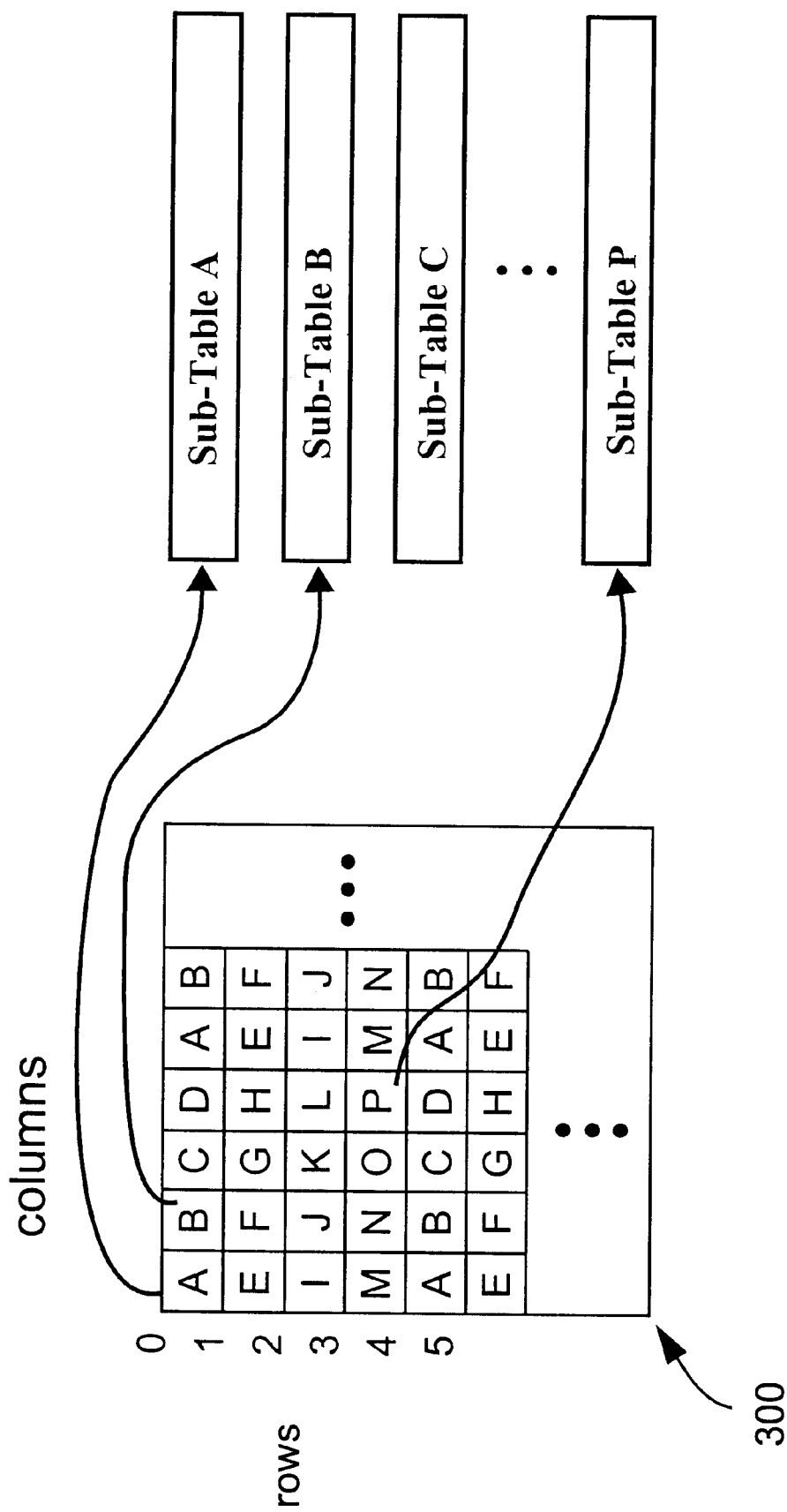
FIG. 3 illustrates how the current 'significance' states of the coefficients of a code block are arranged in the sub-tables A to P of the respective memory banks 202 of FIG. 2.

FIG. 3 illustrates how the current 'significance' states of the coefficients of a code block are arranged in the sub-tables A to P of the respective memory banks 202. The 'significance' states 300 of the coefficients of the code block are arranged in a predetermined manner in the sub-tables A to P. The 'significance' states 300 of the code block are arranged in similar fashion to that of the pixel coefficients of the code block. Namely, the 'significance' states 300 are arranged in rows and columns corresponding to the rows and columns of the coefficients of the code block. The 'significance' states 300 are allocated to various sub-tables A to P, depending on the remainder of the row and column when divided by 4. For example, if both the row remainder and column remainder in a row and column are zero (0), the 'significance' state is allocated to sub-table A.

Turning now to FIG. 4, there is shown a Table, which illustrates the mapping of the 'significance' states of coefficients of a code block to the sub-tables A to P of FIG. 2. For example, the 'significance' state I in column 0 row 3 of the 'significance' states 300 has a column remainder of zero (0) and a row remainder of three (3) and thus according to the Table shown in FIG. 4 will be allocated to sub-table I.

Figure 5:
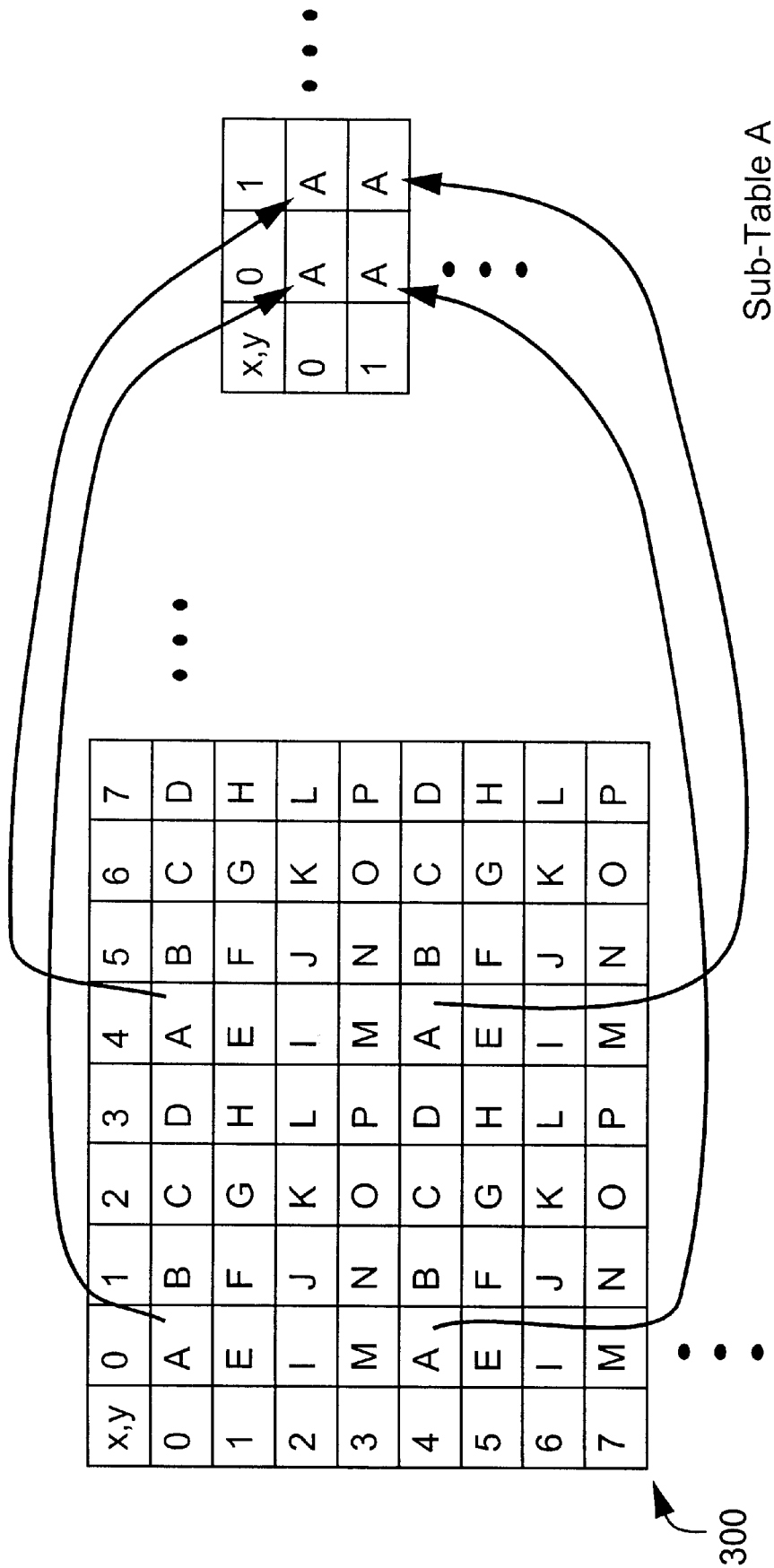
FIG. 5 shows how the relevant 'significance' states of the coefficients of the code block are mapped within the sub-table A of FIG. 2.

Turning now to FIG. 5 there is shown how the relevant 'significance' states of the coefficients of the code block are mapped within the sub-table A. The other 'significance' states are mapped within the other sub-table B to P in similar fashion. The 'significance' states A of the total 'significance' states 300 of the coefficients of the code block are mapped to sub-table A in the same order as they are found in the code block. For example:

'significance' state A at pixel location (0,0) of 'significance' states 300 is mapped to pixel location (0,0) in sub-table A;

'significance' state A at pixel location (4,0) of 'significance' states 300 is mapped to pixel location (1,0) in sub-table A;

'significance' state A at pixel location (0,4) of 'significance' states 300 is mapped to pixel location (0,1) in sub-table A;

'significance' state A at pixel location (4,4) of 'significance' states 300 is mapped to pixel location (1,1) in sub-table A; and so on.

Returning now to FIG. 2, the addressing of the 'significance' states of a 4×4 neighbourhood stored in the sixteen memory banks 202 will be explained. The address generator 204 automatically calculates sixteen addresses to fetch the 'significance' states of the 4×4 neighbourhood of the bit symbol to be encoded from the respective 16 sub-tables A to P. These addresses are based on the pixel location of the bit symbol to be encoded and are calculated using the following algorithm. It should be noted that the pixel location of a bit symbol is the same as the pixel location of the coefficient to which the bit symbol belongs. Let the pixel location of the bit symbol in the code block be (x,y) and let q=x/4, where q is a quotient r=y/4 where r is a quotient s=x % 4 where is a remainder t=y % 4 where t is a remainder Turning now to FIG. 6, there is shown a Table, which shows the addresses to the sub-tables A to P. This Table shown in FIG. 6 is explained with reference to an example. In this example, the bit symbol to be encoded has a pixel location of (2,2) supplied by the pixel location counter 108. The address generator 204 calculates the following values q=0, r=0, s=2, and t=2 for the pixel location (2,2) in accordance with aforementioned formulae. The address generator 204 then determines from the Table shown in FIG. 6, that the corresponding address for table A is (1,1), for Table B is (0,1), for Table C is (0,1) and so on.

Turning now to FIG. 7, there is shown a Table, which shows how the output multiplexers 206 rearrange the results from the sub-tables A to P to the correct places in the 4×4 neighbourhood. In the example given above, the bit symbol to be encoded has a pixel location of (2,2) and the address generator 204 calculates the values s=2 and t=2 which are supplied by the address generator 204 to the output multiplexers 206. The multiplexers rearrange the results from the sub-tables A to P in accordance with the Table shown in FIG. 7. In this example (s=2, t=2), the results from sub-table F are output on the output (−1,−1) of the multiplexers 206, the results from sub-table G are output on output (−1,0) of the multiplexers 206, and so on. As mentioned above, the outputs of the multiplexers 206 are identified in FIG. 2 by the coordinates (−1,−1), (−1,0), (−1,1), . . . , and (2,2) respectively, which indicate the pixel locations of the 4×4 neighbourhood relative to the pixel centre. The output multiplexers 206 re-arrange the order of the 'significance' states output from the memory banks so that they go to the correct outputs of the multiplexers 206.

As mentioned before, the memory banks 202 supply current 'significance' states of a 4×4 neighbourhood of coefficients, which coefficients include the coefficient containing the bit symbol to be encoded and the 15 surrounding coefficients. According to the draft JPEG 2000 standard mentioned above, when any of the surrounding coefficients lie outside the current code block, it is regarded as having a zero (0) 'significance' state. In this case, the address generator 204 determines by logic circuitry that the current neighbouring coefficient lies outside the code block and consequently does not address any sub-table for this neighbouring coefficient. The address generator 204 will however supply a zero 'significance' state to an appropriate input of the output multiplexers 206 for this neighbouring coefficient.

Figure 8:
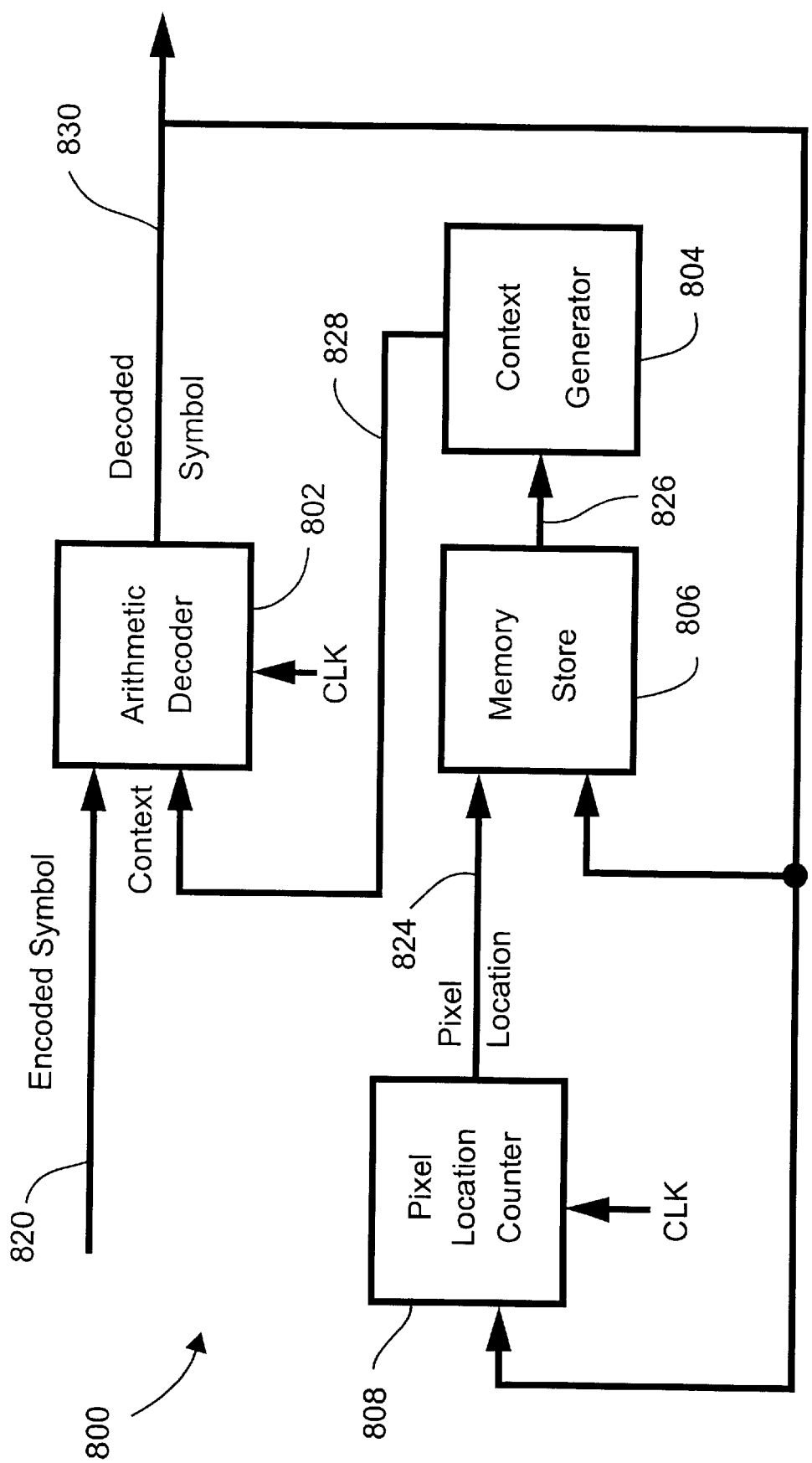
FIG. 8 shows a schematic diagram of an entropy decoder comprising an arithmetic decoder and context generator.

Turning now to FIG. 8, there is shown a schematic diagram of an entropy decoder comprising an arithmetic decoder and context generator. This entropy decoder 800 in principle mimics the entropy encoder 100 of FIG. 1, in that it performs the 'reverse' of those operations of the entropy encoder 100. The entropy decoder 800 comprises an arithmetic decoder 802, context generator 804, memory store 806, and pixel counter 808. The arithmetic decoder 802 takes as input the bit stream 820 to be decoded and the context 828 of the next decoded bit symbol. In a similar fashion to the entropy encoder 100, the entropy decoder decodes all the encoded symbols of the most significant bit-plane of the code block and so on to the least significant bit-plane. The arithmetic decoder 802 decodes the encoded bit symbols of each bit-plane of a code block in a predetermined order according to the draft JPEG 2000 standard. According to this standard, the position of the next symbol to be decoded sometimes depends on the current decoded symbol. Thus the need for the feedback of the decoded symbol 830 to the pixel location counter 808. However, the order in which these symbols are decoded is not essential to the invention and will not be described further. The context 828 of the symbol 820 to be decoded by the arithmetic decoder 802 is based on the 'significance' state of the 8 surrounding pixel coefficients, which are output 826 from memory store 806. These eight 'significance' states in the memory store 806 are addressed by the pixel coefficient location of the bit symbol to be decoded, which pixel coefficient location is supplied by the pixel counter 808. The output 826 from the memory store 806 is fed to the context generator 104, which determines the context state 828 those eight 'significance' states belong to and feeds that context state 128 to the arithmetic decoder 802. The context 828 of the decoded bit symbol is generated in accordance with the draft JPEG 2000 standard and is not essential to the present invention and will not be described any further.

Preferably, the memory store 806 stores for each pixel coefficient in the code block the current 'significance' state of the coefficient at an address corresponding to the pixel coefficient's location in the code block. Prior to decoding the bit symbols, the 'significance' state of all the bit symbols of a code block stored in the memory store 806 are set to zero.

The memory organisation structure, addressing, output multiplexers and structural details of the memory store 806 are the same as that described with reference to the preferred embodiment of the memory store 106 and will not be described further. Moreover, the significance table stored in memory store 806 is updated in similar fashion to the preferred memory store 106. Namely, if the decoded bit is zero (0) then the original 'significance' state is not changed. On the other hand, if the decoded bit is one (1) then this decoded bit is written to the table for the corresponding pixel location. The alternative embodiment of the memory store 106 which stores bit-plane numbers at which the 'significance' state changes is not suitable for use in the decoder 800.

Industrial Applicability

It is apparent from the above that the embodiment(s) of the invention are applicable to the computer graphics and other related industries.

The foregoing describes only some embodiments of the present invention, and modifications and/or changes can be made thereto without departing from the scope and spirit of the invention, the embodiment(s) being illustrative and not restrictive. For example, the information may be partly duplicated in the sub-tables, as long as the information in each sub-table is not identical.

I claim:

1. Apparatus for accessing an n×m sub-block of symbols surrounding and including a symbol specified by an input address from an N×M block of symbols, where N and M are greater than n and m, the apparatus comprising:

a plurality of memory banks, wherein the symbols of any one said n×m sub-block of the N×M block are stored in separate respective said memory banks; and an address generator for simultaneously generating addresses for respective said memory banks in response to said input address, wherein said plurality of memory banks simultaneously output in response to said generated addresses, the symbols of the corresponding sub-block surrounding and including the symbol specified by the input address.

2. Apparatus as claimed in claim 1, wherein the plurality of memory banks store all the said symbols of the N×M block with no duplication of any said symbols.

3. Apparatus as claimed in claim 1 or 2, wherein each said symbol is representative of a significance state of an associated coefficient of a code block.

4. Apparatus as claimed in claim 3, wherein each said symbol is a bit symbol representative of a current significance state of an associated coefficient of the code block.

5. Apparatus as claimed in claim 3, wherein each said symbol comprises a bit-plane number indicating where a significance state of an associated coefficient of the code block changes.

6. Apparatus as claimed in claim 1 or 2, wherein said plurality is sixteen and said sub-block comprises 4×4 symbols surrounding and including said symbol specified by the input address.

7. Apparatus as claimed in claim 1 or 2, wherein said plurality is equal to $2^i \times 2^j$, and the sub-block comprises $2^i \times 2^j$ symbols.

8. Apparatus as claimed in claim 1 or 2, wherein the apparatus further comprises:

a re-arrangement device for re-arranging the order of the output of the symbols of the sub-block.

9. Apparatus as claimed in claim 1 or 2, wherein said apparatus further comprises:

a write controller for writing one or more symbols to one or more said memory banks.

10. Apparatus as claimed in claim 1 or 2, wherein said apparatus is able to read and write said symbols in one clock cycle.

11. Apparatus as claimed in claim 3, wherein said input address specifying the address of the symbol is indicative of a row number and a column number of a said coefficient.

12. Apparatus as claimed in claim 3, wherein said coefficients comprise pixels.

13. Apparatus as claimed in claim 3, wherein said coefficients comprise wavelet coefficients.

14. Apparatus as claimed in claim 1 or 2, wherein said apparatus is configured for entropy encoding.

15. Apparatus as claimed in claim 1 or 2, wherein said apparatus is configured for entropy decoding.

16. Apparatus as claimed in claim 3, wherein said apparatus further comprises:

a write controller for writing a symbol indicating a current significance state of an associated coefficient of the code block to a corresponding said memory bank.

17. An entropy encoder for encoding symbols, the entropy encoder comprising:

a plurality of memory banks for storing symbols of an N×M block of symbols, wherein the symbols of any one n×m sub-block of the N×M block are stored in separate respective said memory banks, where N and M are greater than n and m;

an arithmetic encoder for arithmetically encoding an input symbol utilising a context of said input symbol;

an address generator for simultaneously generating addresses for respective said memory banks in response to one input address corresponding to said input symbol, wherein said plurality of memory banks simultaneously output in response to said generated addresses, the symbols of a corresponding said n×m sub-block surrounding and including a symbol specified by the input address; and a context generator for generating said context of said input symbol utilising said symbols output by said plurality of memory banks.

18. An entropy encoder as claimed in claim 17, wherein the plurality of memory banks store all the said symbols of the N×M block with no duplication of any said symbols.

19. An entropy encoder as claimed in claim 17 or 18, wherein each said symbol of the N×M block is representative of a significance state of an associated coefficient of a code block.

20. An entropy encoder as claimed in claim 19, wherein each said symbol of the N×M block is a bit symbol representative of a current significance state of an associated coefficient of the code block.

21. An entropy encoder as claimed in claim 19, wherein each said symbol of the N×M block comprises a bit-plane number indicating where a significance state of an associated coefficient of the code block changes.

22. An entropy encoder as claimed in claim 17 or 18, wherein said plurality is sixteen and said sub-block comprises 4×4 symbols surrounding and including said symbol specified by said input address.

23. An entropy encoder as claimed in claim 17 or 18, wherein said plurality is equal to $2^i \times 2^j$, and the sub-block comprises $2^i \times 2^j$ symbols.

24. An entropy encoder as claimed in claim 17 or 18, wherein the entropy encoder further comprises:

a re-arrangement device for re-arranging the order of the output of the symbols of the sub-block.

25. An entropy encoder as claimed in claim 17 or 18, wherein said entropy encoder further comprises:

a write controller for writing one or more symbols to one or more said memory banks.

26. An entropy encoder as claimed in claim 17 or 18, wherein said entropy encoder is able to arithmetically code one said input symbol in one clock cycle.

27. An entropy encoder as claimed in claim 19, wherein said input address is indicative of a row number and a column number of an associated coefficient of the code block.

28. An entropy encoder as claimed in claim 17 or 18, wherein said plurality is sixteen and said n×m sub-block comprises 4×4 symbols surrounding and including said symbol specified by said input address, and wherein said context generator generates said context based on those 8 symbols of said 4×4 sub-block surrounding and adjacent to said symbol specified by said input address.

29. An entropy encoder as claimed in claim 19, wherein said coefficients comprise pixels.

30. An entropy encoder as claimed in claim 19, wherein said coefficients comprise wavelet coefficients.

31. An entropy decoder for decoding symbols, the entropy decoder comprising:

a plurality of memory banks for storing symbols of an N×M block of symbols, wherein the symbols of any one n×m sub-block of the N×M block are stored in separate respective said memory banks, where N and M are greater than n and m;

an arithmetic decoder for arithmetically decoding an input symbol utilising a context of said input symbol;

an address generator for simultaneously generating addresses for respective said memory banks in response to one input address corresponding to said input symbol, wherein said plurality of memory banks simultaneously output in response to said generated addresses, the symbols of a corresponding said n×m sub-block surrounding and including a symbol specified by the input address; and a context generator for generating said context of said input symbol utilising said symbols output by said plurality of memory banks.

32. An entropy decoder as claimed in claim 31, wherein the plurality of memory banks store all the said symbols of the N×M block with no duplication of any said symbols.

33. An entropy decoder as claimed in claim 31 or 32, wherein each said symbol of the N×M block is representative of a significance state of an associated coefficient of a code block.

34. An entropy decoder as claimed in claim 33, wherein each said symbol of the N×M block is a bit symbol representative of a current significance state of an associated coefficient of the code block.

35. An entropy decoder as claimed in claim 31 or 32, wherein said plurality is sixteen and said sub-block comprises 4×4 symbols surrounding and including said symbol specified by the input address.

36. An entropy decoder as claimed in claim 31 or 32, wherein said plurality is equal to $2^i \times 2^j$, and the sub-block comprises $2^i \times 2^j$ symbols.

37. An entropy decoder as claimed in claim 31 or 32, wherein the entropy decoder further comprises:

a re-arrangement device for re-arranging the order of the output of the symbols of the sub-block.

38. An entropy decoder as claimed in claim 31 or 32, wherein said entropy decoder further comprises:

a write controller for writing one or more symbols to one or more said memory banks.

39. An entropy decoder as claimed in claim 31 or 32, wherein said entropy decoder is able to arithmetically decode one said input symbol in one clock cycle.

40. An entropy decoder as claimed in claim 33, wherein said input address is indicative of a row number and a column number of an associated coefficient of the code block.

41. An entropy decoder as claimed in claim 31 or 32, wherein said plurality is sixteen and said n×m sub-block comprises 4×4 symbols surrounding and including said symbol specified by said input address, and wherein said context generator generates said context based on those 8 symbols of said 4×4 sub-block surrounding and adjacent to said symbol specified by said input address.

42. An entropy decoder as claimed in claim 33, wherein said coefficients comprise pixels.

43. An entropy decoder as claimed in claim 33, wherein said coefficients comprise wavelet coefficients.

44. A method of accessing an n×m sub-block of symbols surrounding and including a symbol specified by an input address from an N×M block of symbols, where N and M are greater than n and m, the method comprising:

storing symbols of the N×M block of symbols in a plurality of memory banks, wherein the symbols of any one n×m sub-block of the N×M block are stored in separate respective said memory banks; and simultaneously generating addresses for respective said memory banks in response to said input address, wherein said plurality of memory banks simultaneously output in response to said generated addresses, the symbols of the corresponding sub-block surrounding and including the symbol specified by the input address.

45. A method as claimed in claim 44, wherein the storing step stores all the said symbols of the N×M block with no duplication of any said symbols.

46. A method of entropy encoding symbols, the method comprising:

storing symbols of an N×M block of symbols in a plurality of memory banks, wherein the symbols of any one n×m sub-block of the N×M block are stored in separate respective said memory banks, where N and M are greater than n and m;

arithmetically encoding an input symbol utilising a context of said input symbol;

simultaneously generating addresses for respective said memory banks in response to one input address corresponding to said input symbol, wherein said plurality of memory banks simultaneously output in response to said generated addresses, the symbols of a corresponding said n×m sub-block surrounding and including a symbol specified by the input address; and generating said context of said input symbol utilising said symbols output by said plurality of memory banks.

47. A method as claimed in claim 46, wherein the storing step stores all the said symbols of the N×M block with no duplication of any said symbols.

48. A method of entropy decoding symbols, the method comprising:

storing symbols of an N×M block of symbols in a plurality of memory banks, wherein the symbols of any one n×m sub-block of the N×M block are stored in separate respective said memory banks, where N and M are greater than n and m;

arithmetically decoding an input symbol utilising a context of said input symbol;

simultaneously generating addresses for respective said memory banks in response to one input address corresponding to said input symbol, wherein said plurality of memory banks simultaneously output in response to said generated addresses, the symbols of a corresponding said n×m sub-block surrounding and including a symbol specified by the input address; and generating said context of said input symbol utilising said symbols output by said plurality of memory banks.

49. A method as claimed in claim 48, wherein the storing step stores all the said symbols of the N×M block with no duplication of any said symbols.

50. An entropy encoder as claimed in claim 19, wherein the entropy coder further comprises:

a write controller for writing a symbol indicating the current significance state of an associated coefficient of the code block to a corresponding said memory bank.

51. An entropy decoder as claimed in claim 33, wherein each said symbol of the N×M block comprises a bit-plane number indicating where a significance state of an associated coefficient of the code block changes.

* * * * *